Jan. 2, 1968 P. A. ILES ET AL 3,361,594

SOLAR CELL AND PROCESS FOR MAKING THE SAME

Filed Jan. 2, 1964

INVENTORS
PETER ALBERT ILES
BERND ROSS
BY
Lyon & Lyon
ATTORNEYS

United States Patent Office 3,361,594

Patented Jan. 2, 1968

3,361,594
SOLAR CELL AND PROCESS FOR MAKING THE SAME

Peter Albert Iles and Bernd Ross,, Arcadia, Calif., assignors, by mesne assignments, to Globe-Union Inc., Milwaukee, Wis., a corporation of Delaware Filed Jan. 2, 1964, Ser. No. 335,336
11 Claims. (Cl. 136—89)

Figure 1:
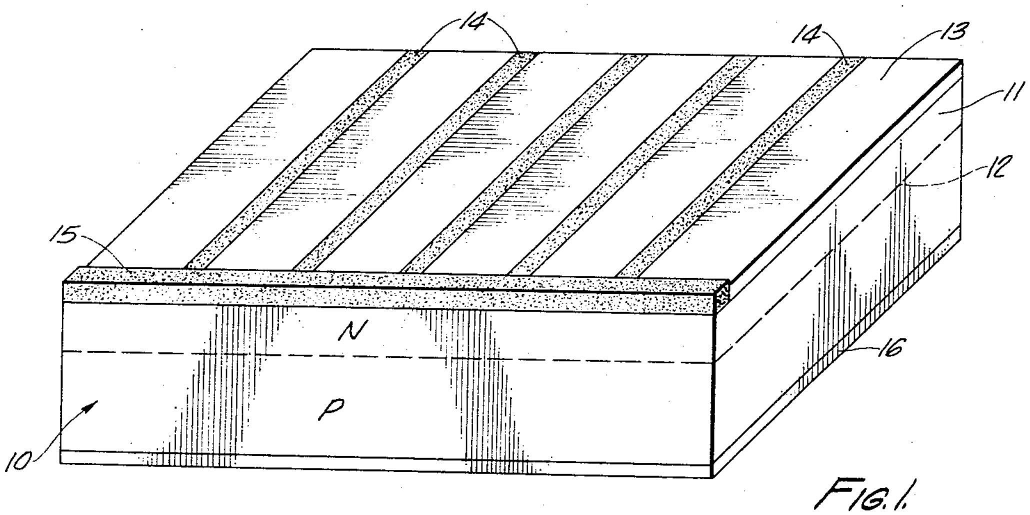

This invention relates to solar cells and more particularly relates to high efficiency, radiation resistant solar cells and a method of making them.

Solar cells may be formed by diffusing a P-type impurity such as boron into a blank or wafer of N-type semiconductor, generally silicon, or by diffusing an N-type impurity such as phosphorus into a wafer of P-type semiconductor to form a junction. One of the primary considerations in constructing and rating solar cells is their efficiency in converting light energy into electrical energy. One factor contributing to this efficiency is the reflectivity of the solar cell.

It has been found that when boron is diffused into N-type silicon, the reflectivity of the resulting boron doped silicon outer surface is only about 5%, as contrasted with the normal reflectivity of silicon of about 35%. On the other hand, doping a P-type silicon wafer with phosphorus has not been found to significantly reduce the wafer's reflectivity. Since the electrical properties of the two type cells are substantially identical, the lower reflectivity and consequent higher efficiency of the P on N cells would normally dictate their use.

It has been found in practice, however, that for reasons not yet completely explained, P on N cells are much less resistant to radiation deterioration than N on P cells. It is therefore necessary that in many situations, particularly space applications, that N on P cells be used. The higher reflectivity of these cells must be accepted in these applications.

Various proposals have been advanced and are currently in use for reducing the reflectivity of these N on P cells. Most of these proposals involve the coating of the exposed surface of the cell with some sort of anti-reflection or interference film. In the construction of such cells, the phosphorus is diffused into the silicon and the resulting glass layer is then removed by etching or sandblasting. The exposed surface is then coated with an acrylic resin or silicon monoxide is vacuum evaporated to form an anti-reflection film. Such a silicon monoxide film is generally made to be an interference film a quarter wavelength thick, the reference wavelength being determined as a function of both the solar spectrum in space and the spectral response of the cell.

The refractive index of the film should be the square root of the product of the refractive index of space (1) times the refractive index of diffused silicon (about 3.5), and thus should be about 1.8, which condition is satisfied by silicon monoxide and to a less extent by acrylic resin. A refractive index for the film of between 1.5–1.8 has been found to be satisfactory.

While the above process produces a useful solar cell, it is expensive, as the vacuum evaporation of the anti-reflection coating is a delicate and time consuming operation. According to the present invention, a process is provided for making a satisfactory N on P solar cell which does not require the deposition of a special coating on the diffused wafer. The process is therefore considerably less expensive and, moreover, the resultant cell is generally as efficient as those previously provided and in some instances more so.

It is therefore an object of the present invention to provide a process for making a low reflectivity N on P solar cell.

It is also an object of the present invention to provide such a process where no specially applied additional anti-reflection coating is necessary.

It is another object of the present invention to provide a N on P solar cell having a reflectivity considerably lower than phosphorus diffused silicon.

Figure 2:
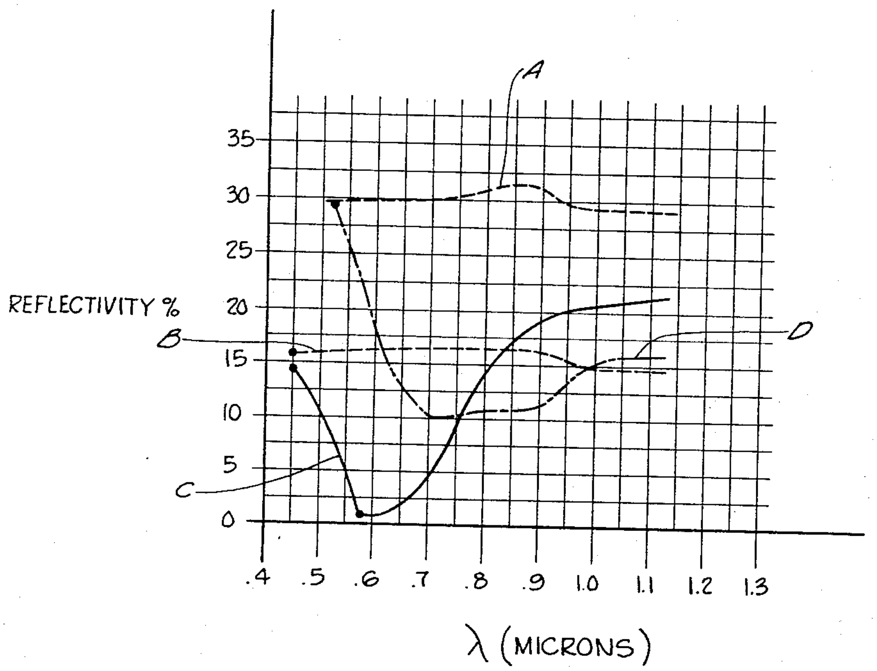

These and other objects and advantages of the present invention will become more apparent upon reference to the accompanying description and drawings in which:

FIGURE 1 is a perspective view of a solar cell according to the present invention; and FIGURE 2 is a chart showing the reflectivity of various solar cells as a function of wavelength.

Turning now to FIGURE 1, there is shown a solar cell constructed according to the present invention. The solar cell includes a block or wafer 10 of P-conductivity type silicon into which phosphorus has been diffused to form an N-conductivity type region 11, the N and P regions being separated by a P–N junction 12. The majority of the upper, radiation receiving surface of the cell is covered with a coating 13 of a phosphoro-silicon glass. The remainder of the upper surface of the cell is covered by grid lines 14 and a contact strip 15. The lower surface of the cell is also covered with a layer 16 of contact material.

The process by which the above described solar cell is formed is as follows. A wafer of P-type silicon is raised to and held at a temperature between 800° C. and 1100° C. A vapor of $P_2O_5$ at a temperature of 220° C. to 370° C. is passed over the silicon in a stream of a carrier gas such as oxygen. This operation results in phosphorus impurity atoms being diffused into the silicon wafer 10 to form the region 11 and the junction 12, and also results in the formation of a coating 13 of phosphoro-silicon glass on the surface of the entire wafer 10. During this operation, conditions are preferably held so that the glass coating formed is of a minimum thickness consistent with a high concentration of phosphorus atoms diffused into the silicon wafer 10. As an alternative to passing a gas over the wafer, it may be painted with $P_2O_5$ dissolved in water or a suitable solvent and then subjected to a diffusion cycle. The glass coating will again be formed.

The wafer is then cooled and the lower surface is sandblasted to remove the glass coating and the phosphorus diffused silicon region and exposed the pure P-silicon. The desired contact pattern is then formed on the upper surface of the solar cell by any conventional process, such as the use of a printing press and ink or a suitable photoresist. The cell is now treated with a suitable etching solution such as hydrofluoric acid to remove the glass coating from the regions of the upper surface of the cell defined by the contact pattern. Contact material which is well known to those skilled in the art, such as nickel or aluminum as disclosed in U.S. Patent No. 2,984,775, gold as disclosed in U.S. Patent No. 3,046,324, or nickel, copper or the like as disclosed in U.S. Patent No. 3,005,862, is then applied to the exposed silicon on the upper surface of the cell to form the grid lines 14 and contact strip 15 and to the entire lower surface of the cell to form the layer 16, and the mask is removed from the upper surface of the cell.

The upper and lower surfaces of the cell are now masked and the edges treated with an etching solution such as hydrofluoric acid—nitric acid mixtures to remove the glass and diffused silicon layers that have been formed by the diffusion operation and to clean the junction of shorting paths. The masks are then removed and the contact regions are soldered in the conventional manner to enable the cell to be connected to an electrical circuit. The solar cell is now complete and ready for use. It will be obvious to one skilled in the art that the chronological occurrence of various of the above process steps is not critical and that therefore the sequence in which they are performed may be changed.

From the foregoing description, it can be seen that the process of the present invention eliminates the need for removing the glass coating formed during the diffusion step and later carefully depositing an anti-reflection coating on the upper surface of the cell. The elimination of this delicate and time-consuming step greatly simplifies the construction of N on P solar cells and reduces their cost. The phosphoro-silicon glass coating that is left on the cell by the present process has been found to have an index of refraction of about 1.5 and thus it forms a satisfactory anti-reflection coating.

The relative performance of cells made by the above described process can be seen by reference to the curves of FIGURE 2. In FIGURE 2, the reflectivity in percent is plotted against wavelength in microns. Curve A shows that the reflectivity of a bare phosphorus diffused silicon cell remains at a fairly constant value of about 30 percent over the entire spectrum. Curve B represents the reflectivity of such a cell coated with a layer of acrylic resin. As can be seen from this curve, such a coating reduces the reflectivity of a cell to about 15%. Curve C shows the reflectivity of a cell that has been coated with a quarter wavelength layer of silicon monoxide. As is to be expected, the reflectivity of this cell is very low at the wavelength to which it has been matched, here about .58 microns. After this wavelength, however, the reflectivity climbs rather steeply until it levels off at about 20%.

Curve D shows the reflectivity of a cell constructed according to the present invention. While the reflectivity of this cell never reaches the lower limit achieved by the silicon monoxide coated cell, its reflectivity remains considerably lower than the silicon monoxide coated cell over a large portion of the spectrum. It is also considerably lower than the acrylic resin coated cell. As a result of this characteristic curve, the efficiency of the glass covered solar cell of the present invention is approximately the same as the silicon monoxide coated cell when the cells are exposed to the full solar spectrum.

While the present invention has been described in terms of a solar cell, it should be understood that it is equally useful in producing other photovoltaic devices, such as photodiodes and readout devices, which have essentially the same characteristics as solar cells. The invention, therefore, may be embodied in other specific forms not departing from the spirit or central characteristics thereof. The present embodiment is to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A process of making a photovoltaic device having a phosphoro-silicon anti-reflection coating, comprising: forming a layer of phosphoro-silicon glass on the upper N-type surface of a wafer of P-type silicon having a diffused P–N junction therein; masking a major portion of said glass layer to define a contact pattern in the unmasked area; removing the glass layer from the unmasked area of the upper surface to expose the diffused silicon surface; depositing electrically conductive metal contact material on said exposed silicon surface to form an electrical contact; and removing the mask to expose said anti-reflection coating.

2. A process of making a photovoltaic device having a phosphoro-silicon anti-reflection coating, comprising: exposing a P-type silicon wafer to phosphorous impurities whereby said impurities are diffused into said wafer to form a P–N junction and a layer of phosphoro-silicon glass is formed on said wafer; masking a major portion of said glass layer on the upper surface of said wafer to define a contact pattern in the unmasked area; removing the glass layer from the unmasked area of the upper surface to expose the diffused silicon surface; depositing electrically conductive metal contact material on said exposed silicon surface to form an electrical contact; and removing the mask to expose said anti-reflection coating.

3. A process of making a photovoltaic device having a phosphoro-silicon anti-reflection coating, comprising: forming a layer of phosphoro-silicon glass on the surfaces of a wafer of P-type silicon having a diffused P–N junction therein; removing said glass layer from the lower surface of the wafer; masking a major portion of said glass layer formed on the upper surface of the wafer to define a contact pattern in the unmasked area; removing the unmasked portion of the glass layer on the upper surface of the wafer to expose the silicon surface thereof; depositing electrically conductive metal contact material on said exposed silicon surface and on said lower surface of said wafer to form electrical contacts; and removing the mask to expose said anti-reflection coating.

4. A process fo making a photovoltaic device having a phosphoro-silicon anti-reflection coating, comprising: passing a vapor of $P_2O_5$ over a wafer of P-type silicon to cause a P–N junction to be formed in said wafer and a layer of phosphoro-silicon glass to be formed on said wafer; removing said glass layer from the lower surface of the wafer; masking a major portion of said glass layer formed on the upper surface of said wafer to define a contact pattern in the unmasked area; etching away the unmasked portion of the glass layer on the upper surface of the wafer to expose the silicon surface thereof; depositing electrically conductive metal contact material on said exposed silicon surface and on said lower surface of said wafer to form electrical contacts; and removing the mask to expose said anti-reflection coating.

5. A process of making a solar cell having a phosphoro-silicon anti-reflection coating, comprising: passing a vapor of $P_2O_5$ over a wafer of P-type silicon while said wafer is at a temperature between 800° C. and 1100° C. and said $P_2O_5$ vapor is at a temperature between 220° C. and 370° C. to cause a P–N junction to be formed in said wafer and a layer of phosphoro-silicon glass to be formed on said wafer; removing said glass layer from the lower surface of the wafer; masking a major portion of said glass layer formed on the upper surface of said wafer to define a contact pattern in the unmasked area; etching away the unmasked portion of the glass layer on the upper surface of the wafer to expose the silicon surface thereof; depositing electrically conductive metal contact material on said exposed silicon surface and on said lower surface of said wafer to form electrical contacts; and removing the mask to expose said anti-reflection coating.

6. A process of making a solar cell having a phosphoro-silicon anti-reflection coating, comprising: passing a vapor of $P_2O_5$ over a wafer of P-type silicon to cause a P–N junction to be formed in said wafer and a layer of phosphoro-silicon glass to be formed on said wafer; removing said glass layer and any phosphorous diffused silicon from the lower surface of the wafer to expose the P-type silicon; masking a major portion of the glass layer formed on the upper surface of the wafer to define a contact pattern in the unmasked area; etching away the unmasked portion of the glass layer formed on the upper surface of said wafer to expose the diffused silicon surface thereof; depositing electrically conductive metal contact material on said exposed silicon surfaces; removing said mask to expose said anti-reflection coating; and removing the glass layer and diffused silicon from the edges of the wafer to expose the P–N junction therein.

7. A photovoltaic device having a phosphoro-silicon anti-reflection coating comprising: a wafer of silicon having a P-type conductivity region and an N-type conductivity region separated by a P–N junction, said N-type region having an upper surface; a layer of phosphoro-silicon glass disposed on a major portion of said upper surface and comprising said anti-reflection coating; and contact means disposed on substantially the remainder of said upper surface for enabling said device to be electrically coupled with an external circuit, said contact means comprising a layer of electrically conductive metal in contact with said N-type region.

8. A solar cell having an upper, radiation receiving phosphoro-silicon anti-reflection coating, comprising: a wafer of silicon having a P-type conductivity region and an N-type conductivity region separated by a P–N junction, said N-type region having an upper surface, a layer of phosphoro-silicon glass disposed on a major portion of said upper surface and comprising said anti-reflection coating; and contact means disposed on substantially the remainder of said upper surface and on the lower surface for enabling said cell to be electrically coupled with an external circuit, said contact means comprising a layer of electrically conductive metal in contact with said N-type region and a layer of electrically conductive metal in contact with said P-type region.

9. A solar cell having an upper, radiation receiving phosphoro-silicon anti-reflection coating, comprising: a wafer of P-type conductivity silicon having phosphorous impurities diffused therein to form an N-type conductivity region, said N-type conductivity region and remaining P-type conductivity region being separated by a P–N junction and said N-type region having an upper surface; a layer of phosphoro-silicon glass disposed on a major portion of said upper surface and forming a contact pattern, said layer of glass comprising said anti-reflection coating; and contact means disposed on substantially the remainder of said upper surface and on the lower surface of said wafer for enabling said device to be electrically coupled with an external circuit, said contact means comprising a layer of electrically conuctive metal in contact with said N-type region and a layer of electrically conductive metal in contact with said P-type region.

10. A solar cell having an upper, radiation receiving phosphoro-silicon anti-reflection coating, comprising: a wafer of P-type conductivity silicon having phosphorous impurities diffused therein to form an N-type conductivity region, said N-type conductivity region and remaining P-type conductivity region being separated by a P–N junction and said N-type region having an upper surface; a layer of phosphoro-silicon glass having an index of refraction between 1.5 and 1.8 disposed on a major portion of said upper surface and forming a contact pattern, said layer of glass comprising said anti-reflection coating; and contact means disposed on substantially the remainder of said upper surface and on the lower surface of said wafer for enabling said device to be electrically coupled with an external circuit, said contact means comprising a layer of electrically conductive metal in contact with said N-type region and a layer of electrically conductive metal in contact with said P-type region.

11. A solar cell having an upper, radiation receiving phosphoro-silicon anti-reflection coating, comprising: a wafer of P-type conductivity silicon having phosphorous impurities diffused therein to form an N-type conductivity region, said N-type conductivity region and remaining P-type conductivity region being separated by a P–N junction and said N-type region having an upper surface; a layer of phosphoro-silicon glass having an index of refraction between 1.5 and 1.8 disposed on a major portion of said upper surface and forming a contact pattern of a narrow region running along the full length of one edge of said upper surface and a plurality of narrow regions connecting with said narrow region and being substantially perpendicular thereto, said layer of glass comprising said anti-reflection coating; and contact means disposed on substantially the remainder of said upper surface and on the lower surface of said wafer for enabling said device to be electrically coupled with an external circuit, said contact means comprising a layer of electrically conductive metal in contact with said N-type region and a layer of electrically conductive metal in contact with said P-type region.

References Cited

UNITED STATES PATENTS

| | | | |
|---|---|---|---|
| 2,802,760 | 8/1957 | Derick et al. | 148—189 |
| 2,984,775 | 5/1961 | Matlow et al. | 148—189 X |
| 2,985,805 | 5/1961 | Nelson | 148—189 X |
| 3,194,701 | 7/1965 | Lothrop | 148—189 |

ALLEN B. CURTIS, *Primary Examiner.*